(12) United States Patent
Kao et al.

(10) Patent No.: US 7,994,828 B2
(45) Date of Patent: Aug. 9, 2011

(54) FREQUENCY DIVIDER, FREQUENCY DIVIDING METHOD THEREOF, AND PHASE LOCKED LOOP UTILIZING THE FREQUENCY DIVIDER

(75) Inventors: Hong-Sing Kao, Hsinchu County (TW); Meng-Ta Yang, Miaoli County (TW); Kuan-Hua Chao, Taipei County (TW); Tse-Hsiang Hsu, Hsin-Chu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 77 days.

(21) Appl. No.: 12/437,541

(22) Filed: May 7, 2009

(65) Prior Publication Data

US 2009/0278574 A1 Nov. 12, 2009

Related U.S. Application Data

(60) Provisional application No. 61/051,682, filed on May 9, 2008, provisional application No. 61/051,685, filed on May 9, 2008.

(51) Int. Cl.
*H03K 21/00* (2006.01)

(52) U.S. Cl. ............. 327/115; 327/117; 377/47; 377/48

(58) Field of Classification Search .......... 327/113–115, 327/117, 118; 377/47, 48
See application file for complete search history.

(56) References Cited

U.S. PATENT DOCUMENTS

| | | | | |
|---|---|---|---|---|
| 6,535,989 B1 * | 3/2003 | Dvorak et al. | ................ | 713/500 |
| 6,542,013 B1 * | 4/2003 | Volk et al. | ..................... | 327/115 |
| 6,617,893 B1 * | 9/2003 | Born et al. | ..................... | 327/115 |
| 6,646,484 B2 | 11/2003 | Ito | | |
| 6,956,793 B2 * | 10/2005 | Ngo | ............................... | 368/156 |
| 7,773,479 B1 * | 8/2010 | Sutardja et al. | ............ | 369/59.11 |
| 7,782,988 B2 * | 8/2010 | Ziesler | ........................... | 375/354 |
| 7,813,466 B2 * | 10/2010 | Huang et al. | .................... | 377/47 |
| 2008/0278203 A1 | 11/2008 | Obkircher | | |
| 2009/0002080 A1 * | 1/2009 | Kim | ............................... | 331/18 |

FOREIGN PATENT DOCUMENTS

| | | |
|---|---|---|
| CN | 1996762 A | 7/2007 |
| JP | P200550228 | 2/2005 |

OTHER PUBLICATIONS

Ping-Ying Wang, Meng-Ta Yang, Shang-Ping Chen, Meng-Hsueh Lin, Jing-Bing Yang, "RTL-based Clock Recovery Architecture with All-Digital Duty-Cycle Correction," Digest of Technical Papers, ISSCC 2007, Session 14, Baseband Signal Processing, 14.1, pp. 254-255, 600, Feb. 13, 2007.

* cited by examiner

*Primary Examiner* — Lincoln Donovan
*Assistant Examiner* — Patrick O'Neill
(74) *Attorney, Agent, or Firm* — Winston Hsu; Scott Margo

(57) ABSTRACT

A frequency divider reduces jitter and power consumption, and includes a phase selector for receiving a plurality of clock signals and outputting an intermediate signal corresponding to phase characteristic of at least one of the clock signals, and an adjustable delay circuit for receiving the intermediate signal and generating an output signal by delaying the received intermediate signal.

19 Claims, 9 Drawing Sheets

FREQUENCY DIVIDER, FREQUENCY DIVIDING METHOD THEREOF, AND PHASE LOCKED LOOP UTILIZING THE FREQUENCY DIVIDER

CROSS REFERENCE TO RELATED APPLICATIONS

The present application is based on, and claims benefit of U.S. Provisional Application No. 61/051,685 filed May 9, 2008 and U.S. Provisional Application No. 61/051,682 filed May 9, 2008, the disclosure of which is incorporated by reference herein in its entirety.

BACKGROUND OF THE INVENTION

1. Field of the Invention

The present invention relates to frequency dividers, and more particularly to a frequency divider capable of reducing jitter and power consumption.

2. Description of the Prior Art

In many applications, a precise output frequency is often generated by a fractional-N frequency divider based on a reference frequency. Whereas an integer-N frequency divider may only generate the output period as an integer multiple of the reference period, e.g. 4 times the reference period, the fractional-N frequency divider may generate fractional multiples of the reference period, such as 4.01 times the reference period. By switching from divide by M to divide by M+1 upon detection of a carry signal or overflow signal, the fractional-N frequency divider is capable of synthesizing frequencies which are a fractional multiple of the reference frequency. For example, the fractional-N frequency divider may output the output frequency as 0.3 times the reference frequency by dividing by 3 in two cycles of a group of three cycles, then dividing by 4 in a remaining one cycle of the group of three cycles.

The fractional-N frequency divider has a complicated circuit design, which has problems of high power consumption, large chip area, and jitter performance.

SUMMARY OF THE INVENTION

According to one aspect of the present invention, there is provided a frequency divider comprising a phase selector for receiving a plurality of clock signals and outputting an intermediate signal corresponding to phase characteristic of at least one of the clock signals, and an adjustable delay circuit for receiving the intermediate signal and generating an output signal by delaying the received intermediate signal.

A phase locked loop in one embodiment comprises a phase detector, a filter coupled to the phase detector, an oscillator coupled to the filter, and a frequency divider coupled to the oscillator and the phase detector. The phase detector is for detecting a phase difference between a reference signal and an input signal, and generating a difference signal indicating the detected phase difference. The filter is for filtering the difference signal to generate a filtered signal. The oscillator is for generating a plurality of clock signals based on the filtered signal. The frequency divider is for generating a frequency-divided signal based on the clock signals, and comprises a phase selector and an adjustable delay circuit coupled to the phase selector. The phase selector is for receiving the clock signals and outputting an intermediate signal corresponding to phase characteristic of at least one of the clock signals. The adjustable delay circuit is for receiving the intermediate signal and generating the frequency-divided signal by delaying the intermediate signal. The input signal corresponds to the frequency-divided signal.

A frequency dividing method according to the embodiments comprises receiving a plurality of clock signals, generating an intermediate signal according to phase characteristic of at least one of the clock signals, and delaying the intermediate signal to generate a frequency-divided signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
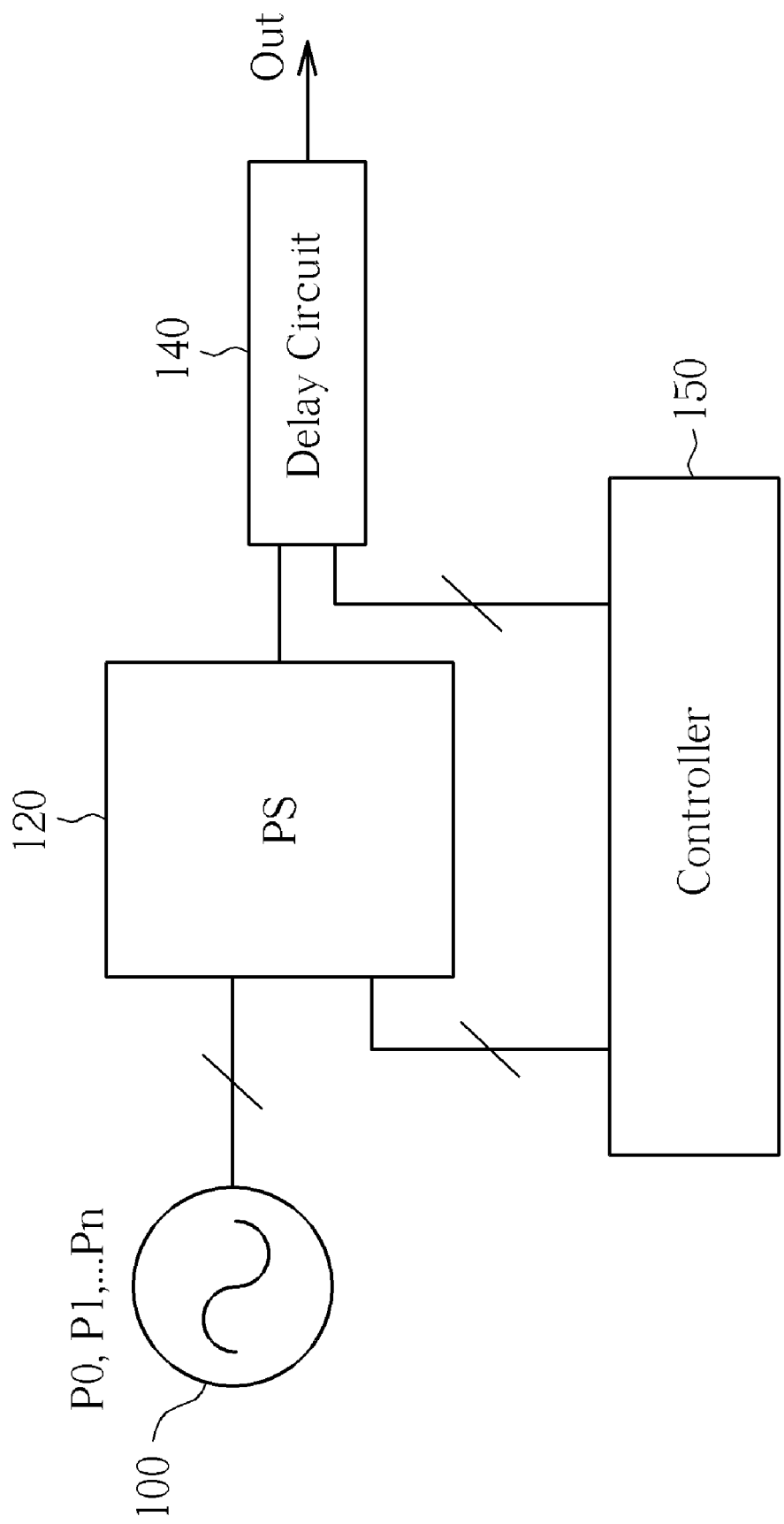
FIG. 1 is a block diagram of a frequency divider according to an embodiment of the present invention.

Please refer to FIG. 1, which is a block diagram of a frequency divider according to an embodiment of the present invention. The frequency divider comprises a phase selector (PS) 120, an adjustable delay circuit 140, and a controller 150. The phase selector 120 receives a plurality of clock signals P0, P1, . . . Pn from a clock generator 100. Each of the clock signals P0, P1, . . . Pn has a predetermined amount of delay with respect to the other clock signals. The predetermined amounts of delay may be $$i \cdot \frac{T}{N},$$

where T is period of the clock signals, N is number of the clock signals, and i=0,1, . . . ,(N−1). For example, for four clock signals (N=4), the clock signal P1 may delay the clock signal P0 by ¼T, the clock signal P2 may delay the clock signal P0 by ²⁄₄T, and the clock signal P3 may delay the clock signal P0 by ¾T, where T is period of the clock signals (the clock signals P0-Pn have substantially the same frequency). The phase selector 120 is capable of receiving the clock signals P0, P1, . . . Pn, and outputting an intermediate signal corresponding to phase characteristic of at least one of the clock signals P0, P1, . . . Pn based on a selecting signal. The adjustable delay circuit 140 is for receiving the intermediate signal from the phase selector 120, and generating an output signal "Out", such as a delayed clock signal, by delaying the received intermediate signal based on a delay control signal. The controller 150 is for generating the selecting signal and the delay control signal, which are sent to the phase selector 120 and the adjustable delay circuit 140, respectively. Please note that, although the selecting signal and the delay control signal are provided by a single controller 150 in this embodiment, this is not meant to be a limitation of the present invention; in other embodiments, the selecting signal and the delay control signal may be provided by different controllers, and the controller(s) may be integrated within the phase selector 120 and the adjustable delay circuit 140. Moreover, the selection function and the delay controlling function provided by the selecting signal and the delay control signal may be predefined in the phase selector 120 and the adjustable delay circuit 140; in this case, the selecting signal and the delay control signal may be omitted.

Figure 2:
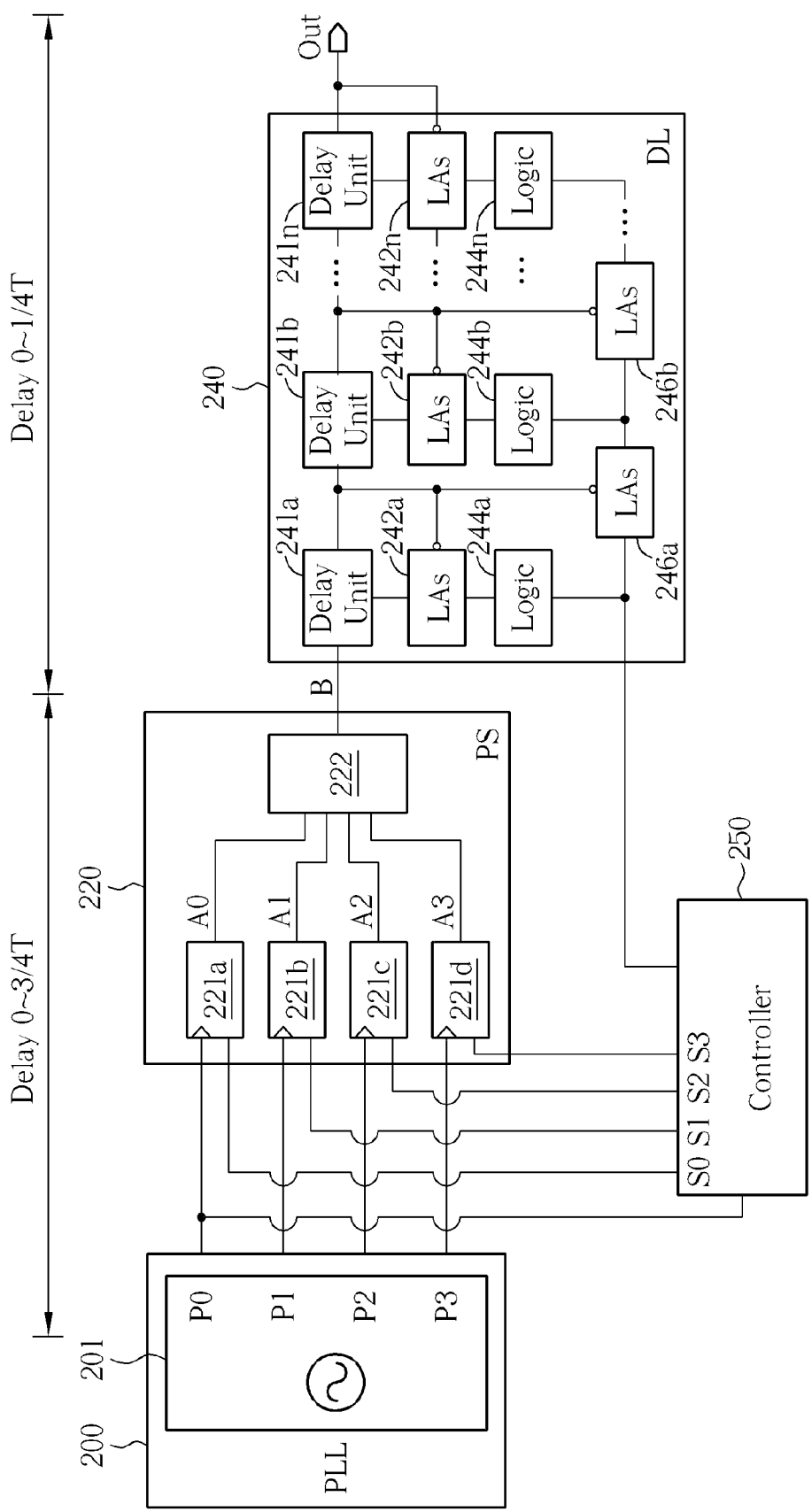
FIG. 2 is a diagram of a frequency divider according to one embodiment of the present invention.

Please refer to FIG. 2, which is a diagram of the frequency divider shown in FIG. 1 according to one embodiment of the present invention. In the frequency divider shown in FIG. 2, N=4, i.e., four clock signals. A clock generator 201 may be part of a phase-locked loop 200 that is capable of outputting four clock signals P0, P1, P2, P3 that may delay a reference clock signal by 0T, ¼T, ½T, and ¾T, respectively. The four clock signals P0, P1, P2, P3 may be received by a phase selector 220. The phase selector 220 comprises four phase-characteristic selecting circuits 221a, 221b, 221c, 221d for receiving the clock signals P0, P1, P2, P3, respectively. The phase-characteristic selecting circuits 221a-221d may be flip-flop circuits. Each phase-characteristic selecting circuit is controlled by a controller 250, which outputs a selecting signal S0-S3 to the phase selector 220. For example, the controller 250 may control the phase-characteristic selecting circuit 221b to select the phase characteristic of the clock signal P1 representing a ¼T delay. In general, the clock generator 201 and the phase selector 220 may account for up to (N−1)/N*T delay of the reference clock signal, in increments of 1/N. The phase-characteristic selecting circuits 221a, 221b, 221c, 221d selectively output the phase characteristics of the clock signals P0, P1, P2, P3 according to the selecting signal S0-S3. Outputs of the phase-characteristic selecting circuits 221a, 221b, 221c, 221d are sent to a combining circuit 222, which may be implemented by logic gates such as logic OR gate, logic NOR gate, logic AND gate, and logic NAND gate, for combining the selected phase characteristics to generate an intermediate signal to an adjustable delay circuit 240. Each of the flip-flop circuits 221a, 221b, 221c, 221d may comprise two input terminals for receiving one of the clock signals P0, P1, P2, P3 and the selecting signal S0-S3, respectively, and an output terminal for outputting phase characteristic of the inputted clock signal when the selecting signal S0-S3 is enabled.

Figure 3:
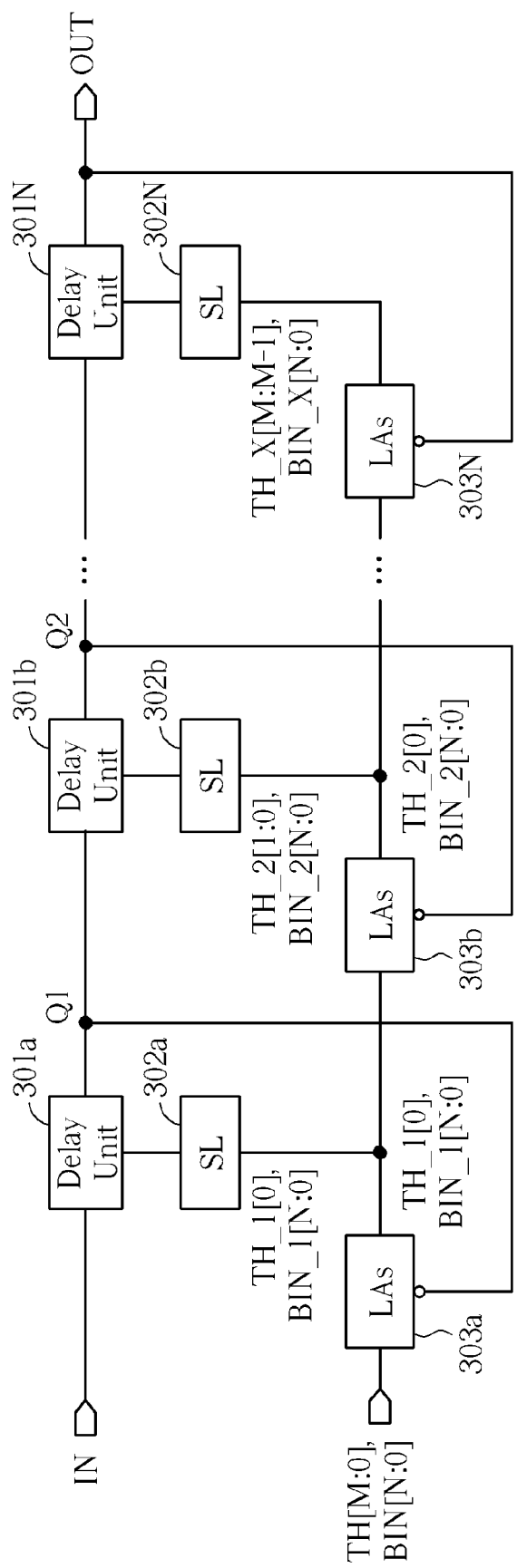
FIG. 3 is a diagram of one embodiment of a pipeline delay circuit of the frequency divider of FIG. 2.
Figure 4:
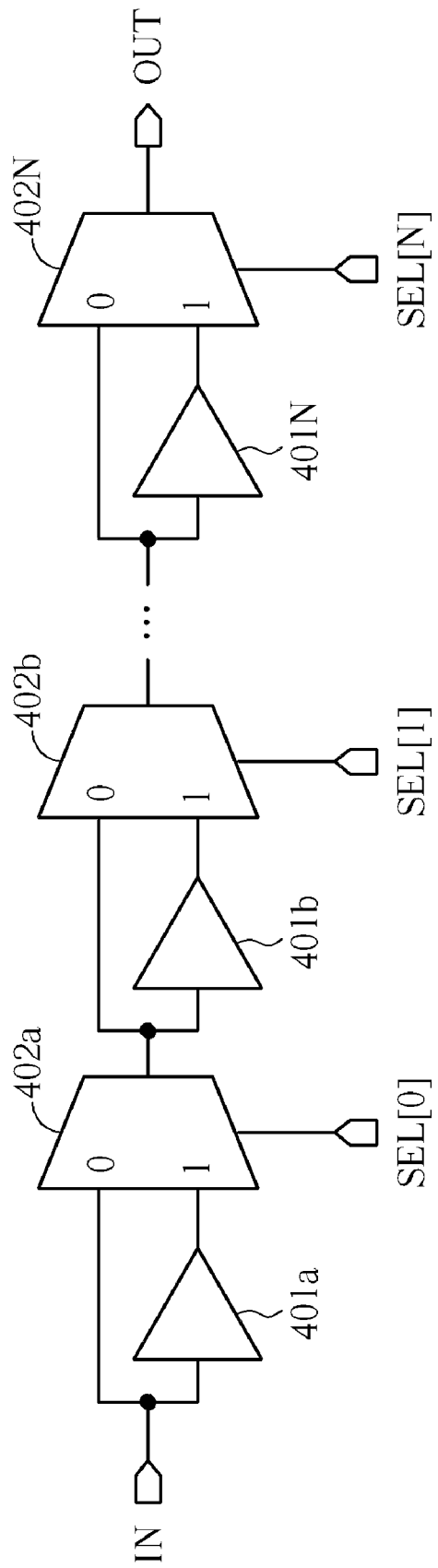
FIG. 4 is a diagram of a first embodiment of an adjustable delay circuit of the frequency divider of FIG. 2.
Figure 5:
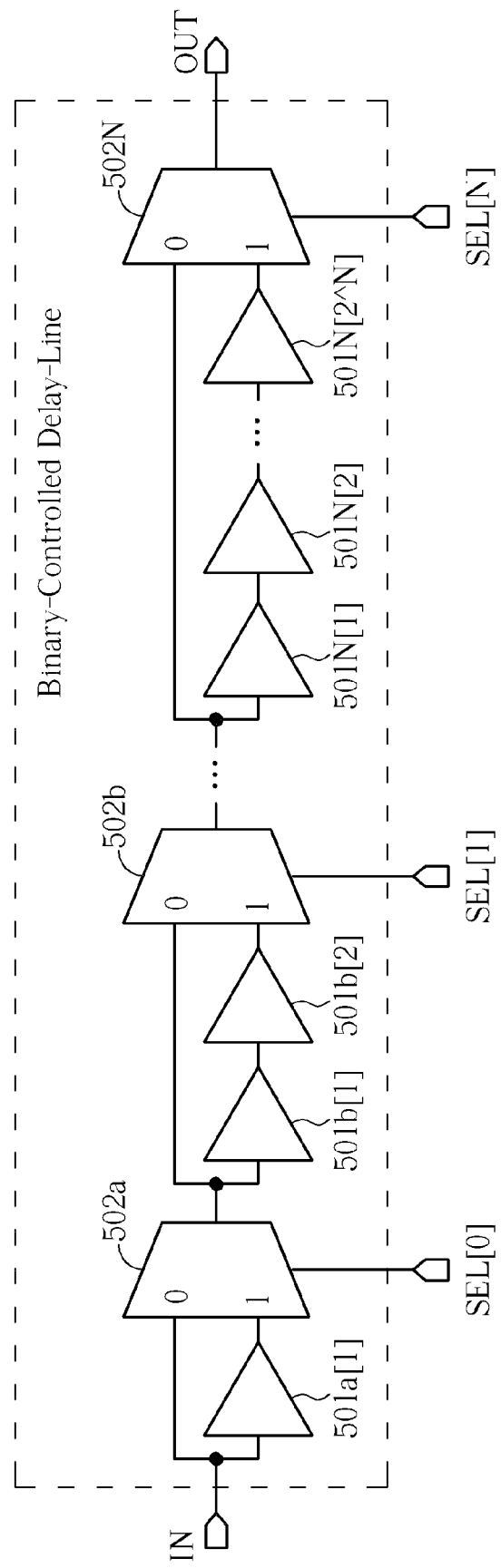
FIG. 5 is a diagram of a second embodiment of the adjustable delay circuit of the frequency divider of FIG. 2.
Figure 6:
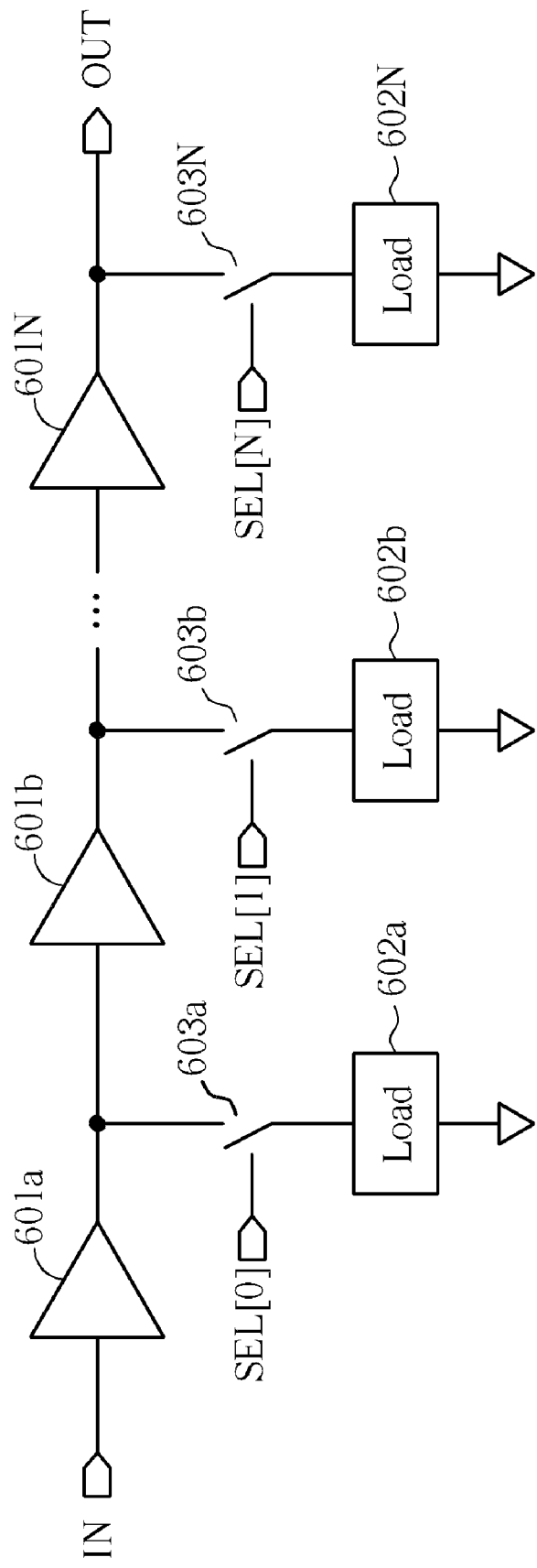
FIG. 6 is a diagram of a third embodiment of the adjustable delay circuit of the frequency divider of FIG. 2.

The adjustable delay circuit 240 may account for up to T/N delay (up to ¼T delay in this embodiment) of the intermediate signal received from the phase selector 220, and is controlled by a delay control signal received from the controller 250. The delay control signal may control the adjustable delay circuit 240 to delay the intermediate signal by 0 to 1/N times period of the clock signals, where N is number of the clock signals. As shown in FIG. 2, the adjustable delay circuit 240 may be a pipeline delay circuit comprising a plurality of delay units 241a, 241b, . . . , 241n whose delay amounts are controllable by the delay control signal. First latches 242a, 242b, . . . , 242n, logic circuits 244a, 244b, . . . , 244n, and second latches 246a, 246b, . . . , 246n form control circuits for the respective delay units 241a, 241b, . . . , 241n for delaying the intermediate signal received from the phase selector 220 according to the delay control signal received from the controller 250. FIG. 3 shows another embodiment of the pipeline delay circuit 240, while FIG. 4-6 show other embodiments of the adjustable delay circuit 240. The pipeline delay circuit shown in FIG. 3 comprises a plurality of delay units 301a, 301b, . . . , 301N, a plurality of selection logic circuits (SL) 302a, 302b, . . . , 302N, and a plurality of latch circuits (LAs) 303a, 303b, . . . , 303N. The delay unit 301a receives an input signal, e.g. the intermediate signal, and outputs a delayed signal O1 to the delay unit 301b. After being delayed by the delay units 301a, 301b, . . . , 301N, the delay unit 302N finally outputs a delayed intermediate signal OUT. The adjustable delay circuit shown in FIG. 4 comprises a plurality of delay circuits 401a, 401b, . . . , 401N, and a plurality of selection circuits 402a, 402b, . . . , 402N. The selection circuit 402a receives an input signal IN and a delayed input signal outputted by the delay circuit 401a, and is controllable by a selection signal SEL[0] for selectively outputting either the input signal IN or the delayed input signal to the following selection circuit 402b and the following delay circuit 401b. By controlling each of the selection circuits 402a, 402b, . . . , 402N to select a delayed signal or a non-delayed signal, the adjustable delay circuit shown in FIG. 4 may provide different delay times for delaying the input signal IN to generate the output signal OUT. The adjustable delay circuit shown in FIG. 5 may be considered a binary-controlled delay line, and comprises a plurality of selection circuits 502a, 502b, . . . , 502N, as well as a plurality of delay circuits 501a[1], 501b[1], 501b[2], . . . , 501N[1], 501N[2], . . . , 501N[2^N]. Operation of the adjustable delay circuit shown in FIG. 5 is similar to operation of the adjustable delay circuit shown in FIG. 4. However, utilization of the selection signals SEL[0], SEL[1], . . . , SEL[N] in the adjustable delay circuit of FIG. 5 results in binary control of the delay time. For example, for N=3, the delay time may range from zero to fifteen times a unit delay of each delay circuit. For SEL[0]=1, SEL[1]=0, SEL[2]=0, and SEL[3]=1, the output signal OUT lags the input signal IN nine times the unit delay. The adjustable delay circuit shown in FIG. 6 includes a plurality of delay circuits 601a, 601b, . . . , 601N, a plurality of load circuits 602a, 602b, . . . , 602N, and a plurality of selection circuits 603a, 603b, . . . , 603N. The selection circuits 603a, 603b, . . . , 603N may couple or decouple the load circuits 602a, 602b, . . . , 602N from the delay circuits 601a, 601b, . . . , 601N, respectively, so as to selectively delay in the input signal IN. Coupling the load circuit adds a delay, and each load may be adjusted to provide different delay characteristics for the adjustable delay circuit of FIG. 6.

Figure 7:
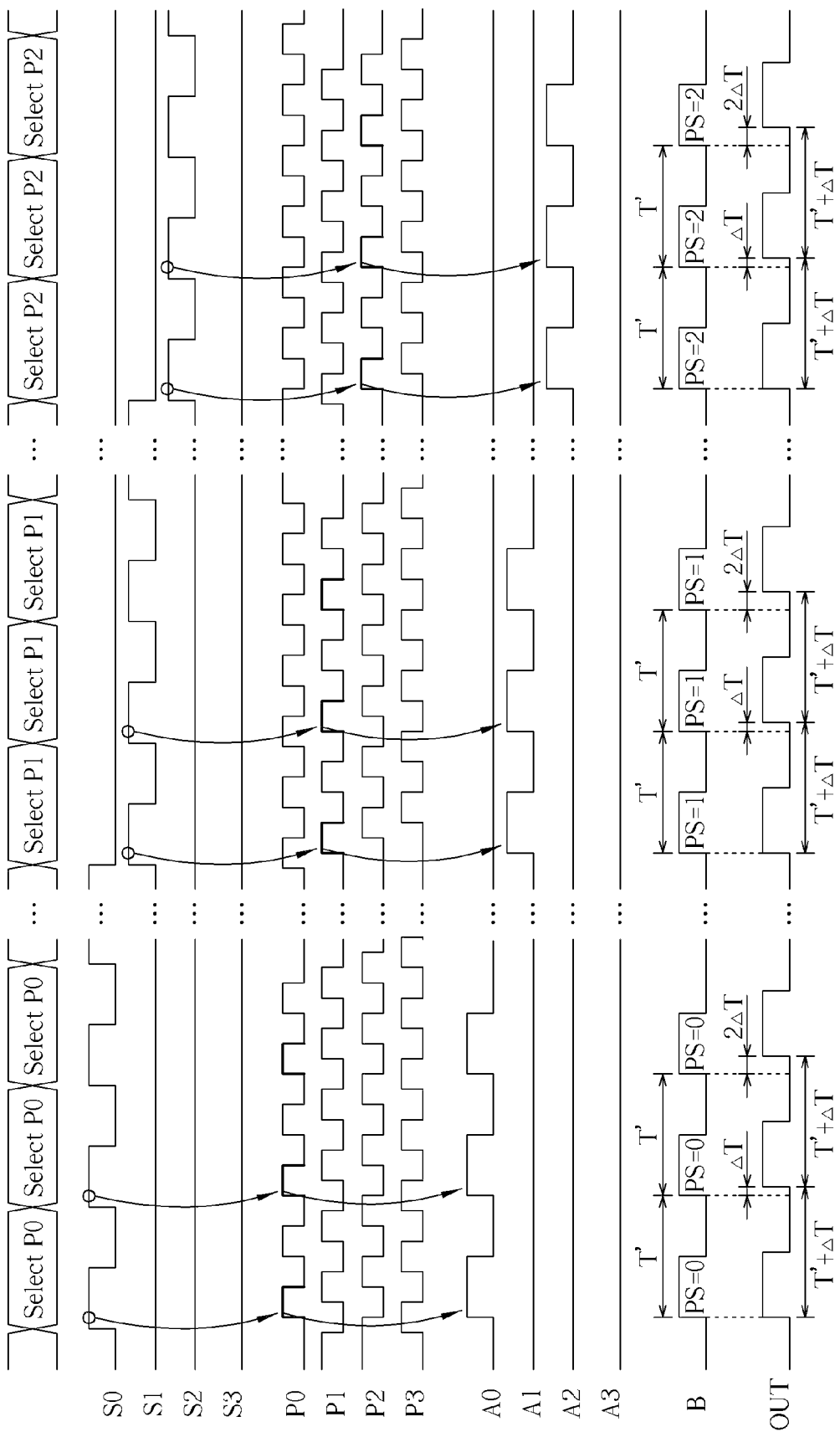
FIG. 7 is a timing diagram of the frequency divider of FIG. 2.

Please refer to FIG. 7, which is a timing diagram of the frequency divider of FIG. 2. The timing diagram in FIG. 7 represents one example of operation of the frequency divider of FIG. 2. As shown in FIG. 7, the clock signal P0 is first selected. Thus, the controller 250 activates the selecting signal S0 corresponding to the flip-flop circuit 221a and deactivates the selecting signals S1-S3 corresponding to the flip-flops 221b-221d. The selecting signal S0 enables the flip-flop circuit 221a, which activates the flip-flop circuit 221a to output a latch signal A0 corresponding to the phase characteristic of the clock signal P0. While the selecting signal S0 enables the flip-flop circuit 221a, the flip-flop circuits 221b, 221c, 221d may be disabled, such that latch signals A1, A2, A3 are inactive. The combining circuit 222 outputs the intermediate signal B having a phase corresponding to the phase of the clock signal P0.

The adjustable delay circuit 240 then delays the pulses of the intermediate signal B to generate an output signal OUT having a period equal to (T'+ΔT). As shown in FIG. 7, the delay amount of the intermediate signal B increases by ΔT. When the delay amount equals T/4 or is going to exceeds T/4, the controller 250 turns to enable the flip-flop circuit 221b and disable the flip-flop circuit 221a in order to make the intermediate signal B have the phase characteristic of the clock signal P1, which is a T/4 delay of the clock signal P0.

The latch signal Al outputted by the flip-flop circuit 221b is received by the combining circuit 222, which outputs the latch signal A1 as the intermediate signal B. Similarly, the adjustable delay circuit 240 delays the pulses of the intermediate signal B by ΔT, 2ΔT, 3ΔT, etc., to keep the output signal at the period (T'+ΔT). Then, once the delay amount equals T/4 or is going to exceed T/4, the controller 250 will turn to enable the flip-flop circuit 221c and disable the flip-flop circuit 221b to make the intermediate signal B have the phase characteristic of the clock signal P2, which is a T/4 delay of the clock signal P1 and T/2 delay of the clock signal P0. In this way, the clock signal is frequency-divided as the output signal OUT. That is, the input frequency 1/T becomes 1/(T'+ΔT) at the output of the frequency divider.

In the above, the frequency divider shown in FIG. 2 is only one embodiment. The number N of the frequency divider may be chosen according to design considerations. Number of the plurality of clock signals may be N, and number of the plurality of phase-characteristic selecting circuits may be N. Number of flip-flop circuits in the phase selector 120, 220, number of clock signals P0, P1, ..., PN, and number of selecting signals S0, S1, ..., SN all may be varied without leaving the teaching described above. Logic gates may be substituted for the flip-flop circuits 221a-221d. Further, the clock generator 100, 200 and the phase selector 120, 220 may account for more or less than ((N−1)/N)T delay of the reference clock signal. Likewise, the adjustable delay circuit 140, 240 may account for more or less than (1/N)T delay of the reference clock signal. The controller 150, 250 may be digital, analog, or mixed. The adjustable delay circuit 140, 240 may employ architectures other than the architecture shown in FIG. 2-FIG. 6.

Because the frequency divider shown in FIG. 1 and FIG. 2 utilizes the phase selector to accomplish 0 to (N−1)*T/N delay, the delay length of the adjustable delay circuit can be significantly reduced. For example, when N=4, a delay of 0-¾T is first provided by the phase selector, the adjustable delay circuit only needs to provide a delay of 0-¼T. The circuit complexity and area of the adjustable delay circuit is reduced, and the frequency divider therefore has a simplified circuit design, with reduced power consumption and area, as well as better jitter performance.

Figure 8:
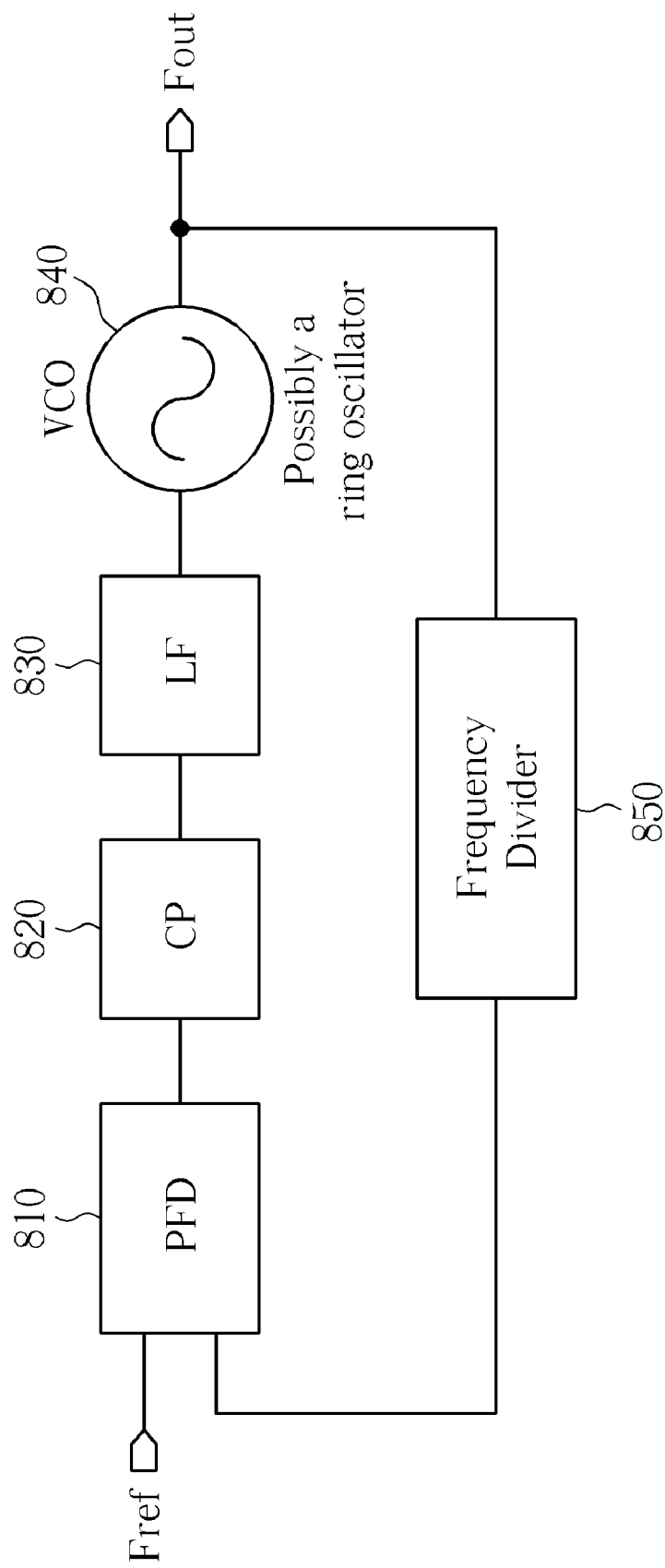
FIG. 8 is a diagram of a phase locked loop utilizing the frequency divider.

Please refer to FIG. 8, which is a diagram of a phase locked loop utilizing the frequency divider. The phase locked loop comprises a phase/frequency detector (PFD) 810, a charge pump (CP) 820, a loop filter (LF) 830, a voltage-controlled oscillator (VCO) 840, and a frequency divider 850, such as the frequency divider shown in FIG. 1 and FIG. 2. The phase detector 810 detects a phase difference between a reference signal Fref and an input signal, and generates a difference signal indicating the detected phase difference. The filter 830 coupled to the phase detector 810 filters the difference signal to generate a filtered signal. The oscillator 840 coupled to the filter 830 generates a plurality of clock signals based on the filtered signal. The frequency divider 850 coupled to the oscillator 840 and the phase detector 810 generates a frequency-divided signal based on the clock signals. The frequency divider 850 may comprise a phase selector and an adjustable delay circuit. The phase selector receives the clock signals and outputs an intermediate signal corresponding to phase characteristic of at least one of the clock signals. The adjustable delay circuit coupled to the phase selector receives the intermediate signal and generates the frequency-divided signal by delaying the intermediate signal. The input signal corresponds to the frequency-divided signal. In the above, the oscillator 840 may be a ring oscillator. The phase locked loop may also comprise a controller coupled to the frequency divider 850. The controller may control the phase characteristic selection of the phase selector of the frequency divider 850 to generate the intermediate signal, and may also control the delay of the adjustable delay circuit of the frequency divider 850 to generate the frequency-divided signal.

Figure 9:
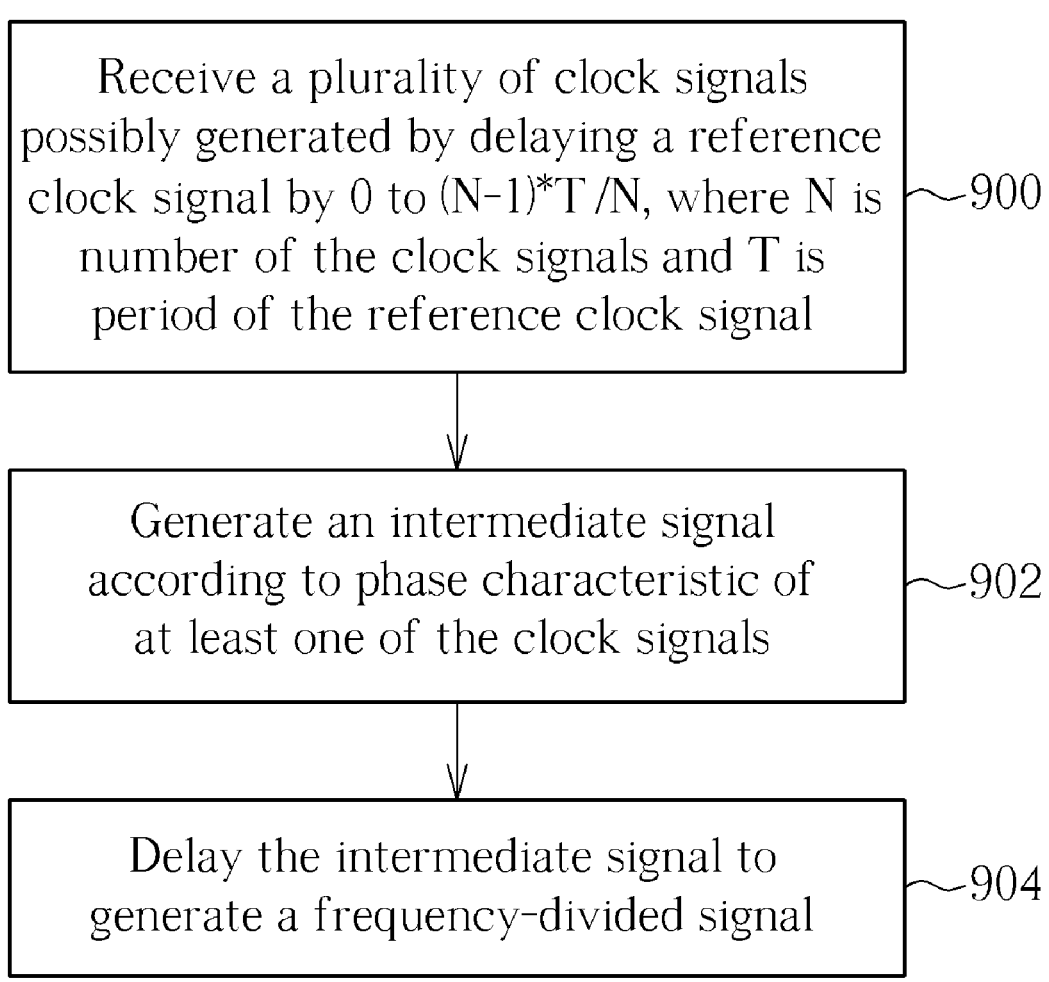
FIG. 9 is a flowchart of a frequency dividing method according to an embodiment of the present invention.

Please refer to FIG. 9, which is a flowchart of a frequency dividing method according to an embodiment of the present invention. The frequency dividing method comprises receiving a plurality of clock signals (Step 900), generating an intermediate signal according to phase characteristic of at least one of the clock signals (Step 902), and delaying the intermediate signal to generate a frequency-divided signal (Step 904). The step of generating the intermediate signal (Step 902) may comprise selectively outputting phase characteristics of the clock signals according to a selecting signal, and generating the intermediate signal by combining the selectively outputted phase characteristics. The clock signals may have predetermined amounts of delay with respect to each other. The clock signals may be generated by delaying a reference clock signal by 0 to (N−1)*T/N, where N is number of the clock signals and T is period of the reference clock signal. The step of delaying the intermediate signal to generate the frequency-divided signal (Step 904) may comprise delaying the intermediate signal by 0 to T/N.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A frequency divider comprising:
a phase selector for receiving a plurality of clock signals and outputting an intermediate signal corresponding to phase characteristic of at least one of the clock signals; and
an adjustable delay circuit for receiving the intermediate signal and generating an output signal by delaying the received intermediate signal, the adjustable delay circuit being a pipeline delay circuit comprising a plurality of delay units controllable by a delay control signal.

2. The frequency divider of claim 1, wherein the clock signals have predetermined amounts of delay with respect to each other.

3. The frequency divider of claim 2, wherein the clock signals have a substantially same frequency.

4. The frequency divider of claim 3, wherein the predetermined amounts of delay are $$i \cdot \frac{T}{N},$$

where T is period of the clock signals, N is number of the clock signals, and i=0,1, ..., (N−1).

5. The frequency divider of claim 1, wherein the phase selector comprises:
   a plurality of phase-characteristic selecting circuits for receiving the plurality of clock signals, and selectively outputting phase characteristics of the clock signals according to a selecting signal; and
   a combining circuit coupled to the plurality of phase-characteristic selecting circuits for generating the intermediate signal by combining the phase characteristics received from the phase-characteristic selecting circuits.

6. The frequency divider of claim 5, wherein the phase-characteristic selecting circuits comprise a plurality of logic gates.

7. The frequency divider of claim 5, wherein the phase-characteristic selecting circuits comprise a plurality of flip-flop circuits.

8. The frequency divider of claim 7, wherein each of the flip-flop circuits comprises two input terminals for receiving one of the clock signals and the selecting signal, respectively, and an output terminal for outputting phase characteristic of the inputted clock signal when the selecting signal is enabled.

9. The frequency divider of claim 5, wherein the combining circuit comprises a logic gate.

10. The frequency divider of claim 5, wherein number of the plurality of clock signals equals to number of the plurality of phase-characteristic selecting circuits.

11. The frequency divider of claim 1, wherein the delay control signal controls the adjustable delay circuit to delay the intermediate signal by 0 to 1/N times period of the clock signals, where N is number of the clock signals.

12. A phase locked loop, comprising:
   a phase detector, for detecting a phase difference between a reference signal and an input signal, and generating a difference signal indicating the detected phase difference;
   a filter, coupled to the phase detector, for filtering the difference signal to generate a filtered signal;
   an oscillator, coupled to the filter, for generating a plurality of clock signals based on the filtered signal; and
   a frequency divider, coupled to the oscillator and the phase detector, for generating a frequency-divided signal based on the clock signals, the frequency divider comprising:
      a phase selector for receiving the clock signals and outputting an intermediate signal corresponding to phase characteristic of at least one of the clock signals; and
      an adjustable delay circuit coupled to the phase selector for receiving the intermediate signal and generating the frequency-divided signal by delaying the intermediate signal, the adjustable delay circuit being a pipeline delay circuit comprising a plurality of delay units controllable by a delay control signal;
   wherein the input signal corresponds to the frequency-divided signal.

13. The phase lock loop of claim 12, wherein the oscillator is a ring oscillator.

14. The phase lock loop of claim 12, further comprising:
   a controller, coupled to the frequency divider, for controlling the phase characteristic selection of the phase selector of the frequency divider to generate the intermediate signal, and controlling the delay of the adjustable delay circuit of the frequency divider to generate the frequency-divided signal.

15. A frequency dividing method, comprising:
   receiving a plurality of clock signals;
   generating an intermediate signal according to phase characteristic of at least one of the clock signals; and
   delaying, using an adjustable delay circuit, the intermediate signal to generate a frequency-divided signal, the adjustable delay circuit being a pipeline delay circuit comprising a plurality of delay units controllable by a delay control signal.

16. The frequency dividing method of claim 15, wherein the step of generating the intermediate signal comprises:
   selectively outputting phase characteristics of the clock signals according to a selecting signal; and
   generating the intermediate signal by combining the selectively outputted phase characteristics.

17. The frequency dividing method of claim 15, wherein the clock signals have predetermined amounts of delay with respect to each other.

18. The frequency dividing method of claim 15, wherein the clock signals are generated by delaying a reference clock signal by 0 to $(N-1)*T/N$, where N is number of the clock signals and T is period of the reference clock signal.

19. The frequency dividing method of claim 18, wherein the step of delaying the intermediate signal to generate the frequency-divided signal comprises delaying the intermediate signal by 0 to T/N.

\* \* \* \* \*